United States Patent [19]

Aihara et al.

[11] Patent Number: 5,680,085
[45] Date of Patent: Oct. 21, 1997

[54] MAGNETIC FIELD GENERATOR, A PERSISTENT CURRENT SWITCH ASSEMBLY FOR SUCH A MAGNETIC FIELD GENERATOR, AND THE METHOD OF CONTROLLING SUCH MAGNETIC FIELD GENERATOR

[75] Inventors: Katsuzo Aihara, Hitachioota; Shinpei Matsuda, Tokyo; Tomoichi Kamo, Tokai, all of Japan

[73] Assignee: Hitachi, Ltd., Tokyo, Japan

[21] Appl. No.: 462,762

[22] Filed: Jun. 5, 1995

Related U.S. Application Data

[63] Continuation of Ser. No. 31,879, Mar. 16, 1993, abandoned.

[30] Foreign Application Priority Data

Mar. 17, 1992 [JP] Japan ................... 4-059896
Apr. 28, 1992 [JP] Japan ................... 4-109535

[51] Int. Cl.$^6$ ........................................ H01F 1/00
[52] U.S. Cl. .................. 335/216; 505/211; 505/882
[58] Field of Search ........................ 335/216; 361/19, 361/141; 338/32 S; 307/245, 306; 505/211, 705, 844, 879, 881, 882

[56] References Cited

U.S. PATENT DOCUMENTS

| | | | |
|---|---|---|---|
| 3,054,978 | 9/1962 | Schmidlin et al. | 338/32 S |
| 3,141,979 | 7/1964 | Rinia et al. | 335/216 |
| 3,150,291 | 9/1964 | Laquer | 335/216 |
| 3,278,808 | 10/1966 | Bonfeld | 338/32 S |
| 3,359,394 | 12/1967 | Mains | 335/216 |
| 3,707,670 | 12/1972 | Erdman | 338/32 S |

FOREIGN PATENT DOCUMENTS 61-267381  11/1986  Japan.

OTHER PUBLICATIONS

Cruz–Uribe et al., "Compact Heat Switch for Persistent Current Loops", Cryogenics, vol. 20, No. 11, pp. 665–666, Nov. 1980.

*Primary Examiner*—Lincoln Donovan
*Attorney, Agent, or Firm*—Antonelli, Terry, Stout & Kraus, LLP

[57] ABSTRACT

A magnetic field generator has a superconductive coil immersed in a coolant material. When power is supplied to the superconductive coil from a suitable power source, the superconductive coil is energized to generate the magnetic field. The ends of the superconductive coil may then be shorted through a persistent current switch, to maintain the magnetic field without the need for further power. The persistent current switch has a superconductive connection connected across the ends of the superconductive coil and a heater. These components are enclosed in a casing with a gap between these components and the casing. Apertures in the casing permit coolant material to enter the gap. When the heater is energized, it heats the coolant material in the gap until it vaporizes. There is then a significant decrease in the thermal conductivity through the gap and hence the superconductive connection is heated rapidly to its critical temperature. Only low power is needed. When the heater stops being energized, liquid coolant material fills the gap thereby rapidly cooling the superconductive connector to below its critical temperature.

16 Claims, 5 Drawing Sheets

MAGNETIC FIELD GENERATOR, A PERSISTENT CURRENT SWITCH ASSEMBLY FOR SUCH A MAGNETIC FIELD GENERATOR, AND THE METHOD OF CONTROLLING SUCH MAGNETIC FIELD GENERATOR

This application is a continuation application of Ser. No. 08/031,879, filed Mar. 16, 1993, now abandoned.

BACKGROUND OF THE INVENTION

1. Field of the Invention

The present invention relates to a magnetic field generator, and in particular relates to such a magnetic field generator in which the magnetic field is generated by a superconductive coil. The present invention also relates to a persistent current switch assembly for such a magnetic field generator, and to a method of operating such a magnetic field generator.

2. Summary of the Prior Art

In order to generate high magnetic fields, it is known to make use of superconductive coils. Such coils can generate high magnetic fields without needing the very large power demands that are required by a non-superconductive coil. Therefore, it is desirable to make use of magnetic field generators based on superconductive coils for use, for example, in magnetic resonance imaging (MRI), magnetically levitated vehicles, and other situations where high magnetic fields are desired. The superconducting coil is cooled to a temperature below its critical temperature by a suitable coolant material, such as liquid helium or liquid nitrogen.

It is known that if the ends of a superconductive coil are connected together, when it is in the superconducting state, the absence of magnetic resistance permits a current to flow through the coil without requiring external power. Such a current is known as a persistent current. If a superconductive coil in the superconducting state has its ends shorted by a suitable switch, known as a persistent current switch, the superconductive coil can then be disconnected from the power supply.

Normally, a persistent current switch makes use of a superconductive connection and means are provided for causing that superconductive connection to change between superconducting and non-superconducting states. When the superconductive connection is in the superconducting state, it shorts the ends of the superconductive coil permitting the persistent current to flow. When the superconductive connection is in the non-superconducting state, the persistent current cannot flow.

JP-A-1-117004 discloses a persistent current switch in which the switching of the superconductive connection is controlled by a heater. The persistent current switch is immersed in the same coolant material as the superconductive coil, and thus, in the absence of heating, the superconductive connection will be in the superconducting state. If power is supplied to the heater, the superconductive connection is heated and will, after suitable heating, reach its critical temperature, so that it switches to the non-superconducting state. When the heating is removed, the superconductive connection will cool due to the effect of the surrounding coolant material and will eventually return to the superconducting state.

In such a persistent current switch, the speed of the switching operation is determined by the rates at which the superconductive connection can be heated and cooled.

Normally, the superconductive connection and heater are protected by encapsulation by a suitable material, such as a thermally insulating material. However in an article entitled "High Resolution Nuclear Magnetic Resonance Spectroscopy in High Magnetic Fields" by M. D. Sauzada and S. K. Kan in Adv. Electronics and Electron Physics, Vol. 34, No. 42, 1973, page 57, there was disclosed an arrangement for protecting the superconductive connection and the heater of a persistent current switch using a protection box of Teflon. That box had apertures therein to permit the coolant material to enter. The article did not contain further discussion of the purpose of that arrangement.

SUMMARY OF THE INVENTION

In the persistent current switch disclosed in JP-A-1-117004, the times needed to switch the superconductive connection to and from the superconducting state to the non-superconducting state has been found to be large. The reason for this is that a significant amount of the heat supplied by the heater passes to the coolant material rather than heating the superconductive connection. This occurs even when the persistent current switch includes an encapsulant. The transfer to the superconducting from the non-superconducting state also depends on the transfer of heat through the encapsulant material to cool the superconductive connection.

Therefore, at its most general embodiment, the present invention proposes that the superconductive connection and heater of a persistent current switch be enclosed in a casing, but for there to be a gap between the casing and the components therein. Such a gap existed in the structure disclosed in the article by M. D. Sauzada et al referred to above, but the present invention seeks to make advantageous use of that gap.

In particular, it has been realized that if the gap and the heater are configured appropriately, the heater will heat the part of the coolant material which is in the gap, and that heating may cause that coolant material to change from the liquid to the gaseous state. This causes a significant increase in the thermal conductivity, and thus the subsequent heating of the conductive connection will be more rapid, because heat transfer through the casing to the surrounding coolant material is reduced. Furthermore, when the heating ceases, the coolant material in the gap will return to the liquid state, and/or additional coolant material will enter the gap, so that the superconductive connection will be cooled rapidly.

Therefore, according to a first aspect of the present invention, it is proposed that the heater is exposed in the gap. In this way, efficient heating of the coolant material in the gap will be achieved.

In a second aspect, the present invention proposes that the superconductive connection and the heater be mounted on opposite sides of a mounting board, so that both are exposed to the gap.

The casing used in a persistent current switch according to the present invention normally needs to have at least one aperture therein, to permit coolant material to enter the gap, or to allow evaporated coolant material to escape. However, if there is only one aperture, a gas lock may be created at the aperture, then preventing ingress of coolant material when heating is stopped, and slowing the rate at which the superconductive connection changes back to the superconducting state. Therefore it is desirable that a plurality of apertures are provided in the casing.

It should be noted that the present invention relates not only to a magnetic field generator incorporating a persistent current switch, but also to a persistent current switch assembly for such a generator, to a method of controlling a magnetic field using such a persistent current switch.

The present invention is particularly, but not exclusively, concerned with a magnetic field generator in which the superconductive coil and/or the superconductive connection of the persistent current switch are made of a high temperature superconductive material and/or a superconductive oxide material. Such materials offer the significant advantage that their superconductive properties are more stable than a superconductive metallic material. Furthermore, the coolant material may then be liquid nitrogen, which is easier to obtain and handle than liquid helium. Furthermore, such materials have, when they are in the non-superconducting state, a higher resistance than the superconductive metallic materials. Hence, when they are used in a persistent current switch, the currents flowing therethrough when they are connected to a power supply are normally less than the critical current and so will not be maintained in the non-superconducting state by such currents. Thus, with the present invention, the removal of the heating will cause the persistent current switch to switch to its superconducting state.

BRIEF DESCRIPTION OF THE DRAWINGS

Embodiments of the present invention will now be described in detail, by way of example, with reference to the a accompanying drawings, in which.

DETAILED DESCRIPTION

Embodiment 1

A first embodiment of the present invention will be described with reference to FIGS. 1 to 4. The first embodiment relates to a magnetic field generator incorporating a persistent current switch according to the present invention.

Figure 1:
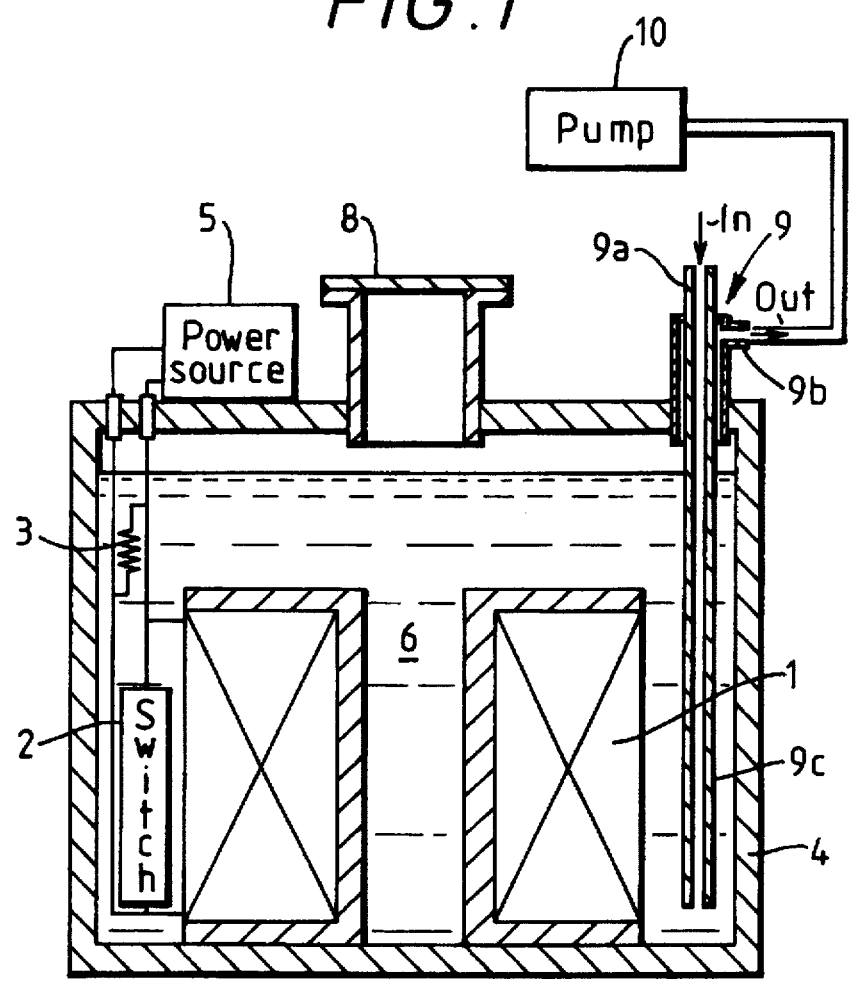
FIG. 1 is a sectional view through a magnetic field generator being a first embodiment of the present invention.

In FIG. 1, a superconductive coil 1 is mounted in a coolant vessel 4. That coolant vessel 4 is filled with coolant material 6, to reduce the temperature of the coil 1 such that it is in the superconducting state. The superconductive coil 1 may be formed, for example, by superconductive wire or tape supported by insulting material.

A persistent current switch 2 is connected across the coil 1, and the coil 1 is connected to a power source 5 outside the coolant vessel 4. The persistent current switch 2 is located at a position where the magnetic field generated by the superconductive coil 1 is relatively weak, so that the behavior of the persistent current switch 2 is not affected by such a magnetic field.

In order to protect the superconductive coil 1 and the persistent current switch 2, a protection resistor 3 is also connected across the coil 1. The function of this protective resistor 3 will be described in more detail later.

In the embodiment of FIG. 1, the cooling vessel 4 is an adiabatic vessel of e.g. stainless steel. The power source 5 is a current controlled DC power supply. FIG. 1 also shows an access cover 8 in the cooling vessel 4, and a duct 9. The duct 9 then inlet 9a communicating with a pipe 9c extending into the coolant vessel 4, for adding coolant 6 to the coolant vessel, and an outlet 9b communicating with the interior of the cooling vessel 4 above the coolant 6. That outlet 9b is connected to a pump 10, if necessary, which permits the pressure within the cooling vessel 4 to be reduced.

Figure 2:
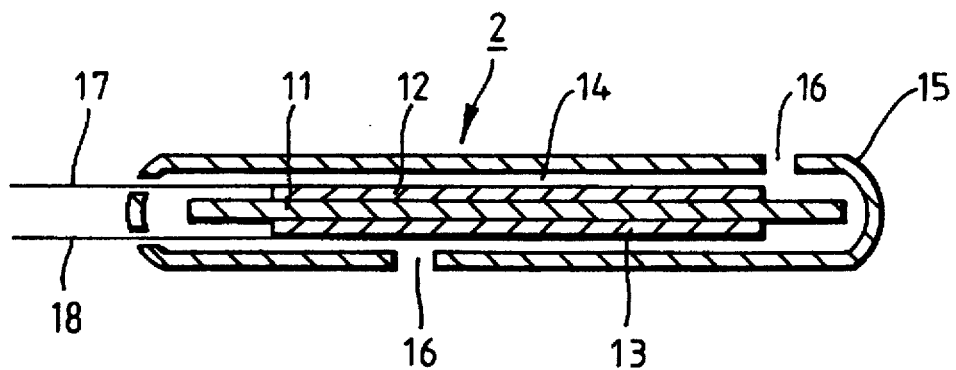
FIG. 2 is a sectional view through the persistent current switch of the embodiment of FIG. 1.
Figure 3:
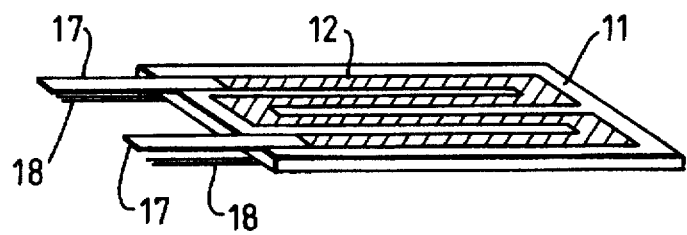
FIG. 3 is a perspective view of part of the persistent current switch of FIG. 2.

As shown in FIGS. 2 and 3, the persistent current switch 2 has a mounting board 11, on one surface of which is mounted a superconductive connection 12. On an opposite surface of the mounting board 11 is a heater 13 which may be e.g. a manganin thin-film heater. FIG. 3 shows that the superconducting connection 12 may be in the form of a convoluted track of superconductive material on the mounting board 11. The mounting board 11 may be made, for example, of $Al_2O_3$, $SrTiO_3$, $MgO$. The mounting board 11 is suitably 0.5 mm thick, 20 mm wide, and 30 mm long. Then, the superconductive connection 12 may be 4 mm wide, 2 μm thick, and 80 mm long.

As shown in FIG. 2, the persistent current switch unit formed by the mounting board 11, the superconductive connection 12, and the heater 13 is mounted in a casing 15, with there being a gap 14 between that casing 15 and the persistent current switch unit. Furthermore, openings 16 are provided in the casing 15 so that coolant 6 in the cooling vessel 4 can fill the gap 14 by flow through the openings 16. Leads 17 and 18 pass out of the casing 15 to the power source 5.

The casing 15 is of thermally insulating material, such as polyimide insulating sheet and epoxy resin. Its thickness will normally be between 0.1 mm and 10 mm. Furthermore, the spacing between the casing 15 and the superconductive connection 12 or heater 13, corresponding to the gap 14, will also be of the order of 0.1 mm to 10 mm, and that spacing corresponding to the gap 14 is preferably similar to the thickness of the casing 15. The volume of the gap 14 is then dependent on the area of the persistent current switch unit, and will be determined by space considerations and also on the current that may be supplied to the heater 13.

In general, spacing corresponding to the gap 14 should be as small as practical, to minimise the power of the heater 13 needed to cause the coolent in the gap 14 to evaporate.

The diameter of the apertures 16 is preferably approximately equal to the thickness of the casing 15, to restrict, but not prevent, the flow of coolant 6 therethrough. Typically, the thickness of the casing 15, the spacing corresponding to the gap 14, and the diameter of the apertures 16 are all of the order of 1 mm. If the apertures 16 have a diameter which is too large, coolant liquid 6 will flow into the gap 14 even when the heater 13 is powered, which may prevent the present invention from operating correctly.

Figure 4:
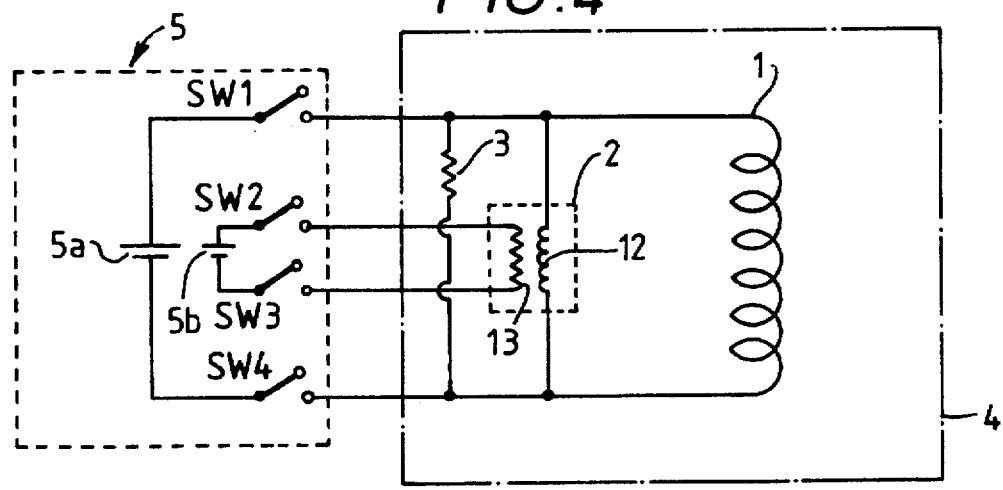
FIG. 4 is a circuit diagram of the first embodiment shown in FIG. 1.

FIG. 4 shows the electrical circuit corresponding to the embodiment of FIG. 1. Those parts within the cooling vessel 4 are indicated by a chain-dotted line, and those parts within the power source 5 are indicated by a dotted line. As can be seen, the superconductive coil 1 is connected to a suitable power generator 5a, and the conductive connection 12 of the persistent current switch 2 is connected across the ends of the coil 1 to be in parallel therewith. The protective resistor 3 is also connected in parallel with the superconductive connection 12. The heater 13 is connected to a separate power source 5b within the power source 5.

In use, with switches SW1 and SW4 closed, the superconductive coil 1 is powered by the power generator 5a so that a current flows through the superconductive coil 1 to generate a suitable magnetic field. When the superconductive connection is in the superconducting state, switches SW1 and SW4 can be opened so that, a persistent current flows through the superconductive coil 1 and the superconductive connection 12. When it is desired to cut-off that persistent current, to increase or decrease the magnetic field, switch SW2 and SW3 are closed thereby applying power from the power generator 5b to the heater 13, causing the superconductive connection 12 to be heated until it passes its critical temperature, and changes to the non-superconducting state.

If, whilst the persistent current flows through the superconductive coil 1 and the superconductive connection 12, the superconductive coil 1 or the superconductive connection 12 accidentally changes to its non-superconducting state, the large amount of stored energy could damage the superconductive coil 1 and the superconductive connection 12. Therefore, to protect the superconductive coil 1 and the superconductive connection 12, the protective resistor 3 is provided in parallel therewith.

When the heater 13 is activated, the fact that the heater 13 is exposed to the gap 14 means that coolant 6 which has entered that gap through aperture 16 is heated. That heating will cause the coolant 6 in the gap 14 to be heated until it changes from the liquid state to the gaseous state. Then, the thermal conductivity across the gap 14 becomes very low, and substantially all the heat from the heater 13 is transferred through the mounting board 11 to the superconductive connection 12, thereby rapidly causing it to change to the non-superconducting state. Thus, the persistent current switch can be activated with only a small amount of heater power.

Once the superconductive connection 12 has changed to the non-superconducting state, the power supply from the power generator 5b to the heater 13 can be adjusted so that the temperature of the superconductive connection 12 can be maintained a little higher than its critical temperature, to maintain it in the non-superconducting state. The coolant 6 cannot enter the gap 14 within the casing 15, as the pressure of the evaporated coolant within that gap prevents the flow through the aperture 16. Thus, if the heater is turned off, the pressure in the gap 14 decreases. This allows the coolant 6 to flow through the aperture 16 into the gap 14. The coolant 6 then rapidly cools the superconductive connection 12, because it is in contact therewith, so that the superconductive connection 12 rapidly returns to the superconducting state. Thus, switching to or from the superconducting state is rapid. If the gap 14 was not provided, more heater power would be needed and the return of the superconductive connection 12 to the superconducting state would be less rapid.

The coolant in this embodiment may be, for example, liquid helium or liquid nitrogen. Liquid nitrogen is preferred. If the superconductive coil 1 and/or superconductive connection 12 is of a metal superconductor, such as Nb—Ti alloy or a Nb—Sn intermetallic compound, however, the coolant needs to be liquid helium. Liquid helium needs a refrigerant vessel of vacuum heat insulation structure as its boiling point is at the low temperature of 4.2K. If the wire of the superconductive coil 1 and the superconductive connection is of an oxide superconductor or other high temperature superconductor, liquid nitrogen may be used. As the boiling point of liquid nitrogen is 77.3K, the cooling structure can be simplified. In addition, liquid nitrogen is very cheap, lower than one tenth the cost of the liquid helium.

Figure 5:
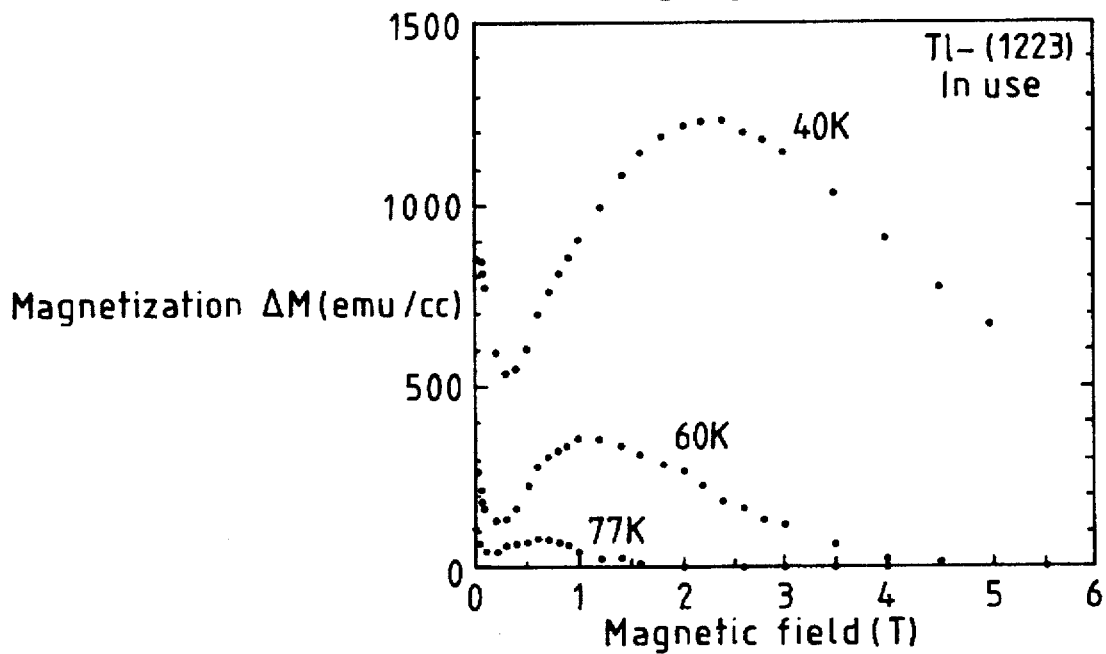
FIG. 5 is a graph illustrating the relationship between magnetization of magnetic field at various temperatures.

The boiling point of liquid nitrogen at atmospheric pressure is 77.3K. However, if the pressure is reduced the boiling point is lowered. For example, under a pressure of 100 Torr the boiling point of liquid nitrogen is 64K. Hence, it is preferable for the high magnetic field generator of the present invention to be operated under such conditions. The pump 10 (see FIG. 1) may be used to reduce the pressure, and hence the boiling point. In general, the critical current density, the critical magnetic field of a superconductive material are improved as the temperature is reduced. When the temperature is lowered at a vicinity 77K, as shown in FIG. 5, the critical current density is significantly improved. Therefore, it is preferable to use a superconductive coil 1 and a superconductive connection 12 of an oxide superconductor from 77K to 64K.

The present invention should preferably use an oxide superconductor for the superconductive connection 12 and the superconductor coil 1.

A magnetic field generator according to the first embodiment of the present invention can use a metal superconductor or compound superconductor for the superconductive coil 1 and the superconductive connection 12. Alternatively, use can be made of any of oxide superconducting substances basic expressions of which are $LnBa_2Cu_3O_{7-\delta}$ [Y-(123)] wherein Ln indicates rare earth elements, such as Y, Ho, and Er, $Bi_2Sr_2CaCu_2O_{8-\delta}$ [Bi(2212)], $Bi_2Sr_2Ca_2Cu_3O_{9-\delta}$ [Bi-2223)], $Tl_2Ba_2CaCu_2O_{8-\delta}$ [Tl-(2212)], $Tl_2Ba_2Ca_2Cu_3O_{9-\delta}$ [Tl-(2223)], $TlBr_2CaCu_2O_{8-\delta}$ [Tl-(1212)], $TlSr_2Ca_2Cu_3O_{9-\delta}$ [Tl-(1223)], or any of their derivatives.

The critical temperatures of oxide superconductors are all higher than the coolant temperature. Preferably, oxide superconductors containing any of thallium, alkaline earth metals, and copper oxides, having a layer perobskite structure, and having one Tl—O layer in its crystal structure should be selected. These superconductors have superior critical temperature and superconducting characteristics in a magnetic field.

Their general Formula 1 is given by $$(Tl_{1-x}A_x)_i(Sr_{1-y}Ba_y)_jCa_kCu_m—O,$$

wherein A is at least one of Pb and Bi, and the suffixes denote ranges as follows.

x=0.01–0.7,
y=0.01–0.7,
i=0.7–1.3,
j=1.5–2.5,
k=0.8–4.0, and
m=1.5–5.0.

It may be noted that if an oxide superconductor is used together with liquid helium as the coolent 6, then the temperature rise of the superconductive connection 12 needed for it to change to the non-superconducting state is large, e.g. of the order of 120K. If liquid nitrogen is used, this temperature rise is of the order of 40K. In order to mitigate this effect, it will normally be necessary to use a larger gap 14 when the coolent 6 is liquid helium.

Use of an oxide superconductor is advantageous in that such superconductors have a higher resistivity. A metal superconductor has a resistivity of about $1.0\times10^{-7} \Omega m$ whilst an oxide superconductor has a resistivity of $1.0\times10^{-5} \Omega m$. Therefore, if an oxide superconductor is used to form the superconductive connection 12, the length of that connection can be 1/100 of the length of an equivalent superconductive connection 12 of metal semiconductor.

Furthermore, the electromagnetic instability of an oxide superconductor is smaller than a metal superconductor, because it has a higher specific heat capacity at the critical temperature. Thus, a metal superconductor has a specific heat capacity of about $1.0\times10^4$ $Jm^{-3}$ at 10K whilst an oxide superconductor will normally have a specific heat capacity of at least $1.0\times10^6$ $Jm^{-3}$ at 120K.

An example of the first embodiment of the present invention will now be described. The persistent current switch 2 had a superconductive connection 12 formed of a film of Tl-(1223) oxide superconductor forming a current path on the upper surface of the mounting board 11, by a laser abrasion method. The heater 13 was of manganin thin-film on the lower surface of the mounting board 11. The board 11 was of a single crystal 0.5 mm thick, 20 mm wide, and 30 mm long, and the superconductive connection 12 was 4 mm wide, 2 μm thick, and 80 mm long. The casing 15 was formed of polyimide insulating sheet and epoxy resin, two holes 16 of around 1 mm diameter.

The persistent current switch 2 was tested by being immersed in liquid nitrogen. It provided a critical current of 25 A and a resistance of 60 ohms in the non-superconducting state when the superconducting state ended by turning on the heater 13. The superconducting state changed to a non-superconducting state in 20 sec with a heater power of 1 W. The non-superconducting state persisted even when the heater power was decreased to 0.1 W. The superconducting connection 12 returned to the superconducting state in 5 sec when the heater was turned off.

On the other hand, a switch in which there was no gap 14 required heater power of at least 0.5 W to change the superconducting state to the non-superconducting state. With the heater power decreased below that level, the non-superconducting state could not be maintained. Thus, it was found that the persistent current switch 2 of the embodiment could maintain the non-superconductive state with one fifth of the heater power of a switch having no gap 14.

In the example, the superconductive coil 1 was of silver sheath tape wire 3 mm wide and 0.1 mm thick. The wire was of Tl-(1223) oxide superconductor with a critical temperature Tc of 122K. The wire was wound together with alumina non-fabric cloth to form a pancake coil, and this was laminated in 12 layers. Its size was 20 mm in inside diameter, 60 mm in outside diameter, and 40 mm in axial length. The persistent current switch 2 was placed at a position where the magnetic field generated by the superconductive coil 1 was weakest, outside the superconductive coil 1. Ends of the superconductive coil 1 were connected (shorted) by the persistent current switch 2.

The protection resistor 3 used in the example had a resistance of 1 ohm. The cooling vessel 4 used was of stainless steel. The power source 5 used was a current-regulated DC power source.

The superconducting coil 1 was caused to generate a magnetic field with the cooling vessel 4 filled with liquid nitrogen. The heater 13 of the persistant current switch 2 received power of 1 W to turn off the persistant current switch 2, and the power source 5 energized the superconductive coil 1. The superconducting coil 1 generated a magnetic field of 1 T at its center when a current of 20 A flowed through it. Then, the heater was turned off, and the persistent current switch 2 was turned on for operation in the persistent current mode. When the power supply was disconnected to check decrease of the magnetic field, this was found to be 5% in one hour. It was thus found that there were no problems for practical use.

The power required for an iron-core electromagnet, liquid helium cooled superconducting electromagnet and the electromagnet of the example of the first embodiment were 4.7, 3.3, and 1 W/kg-T, respectively.

The magnetic field generator was light in weight and so could easily be carried as its net weight, excluding the power supply, was approximately 5 kg.

The magnetic field generator of the example of the first embodiment can have an additional magnetic shield to decrease leaking magnetic field leakage.

Embodiment 2

Figure 6:
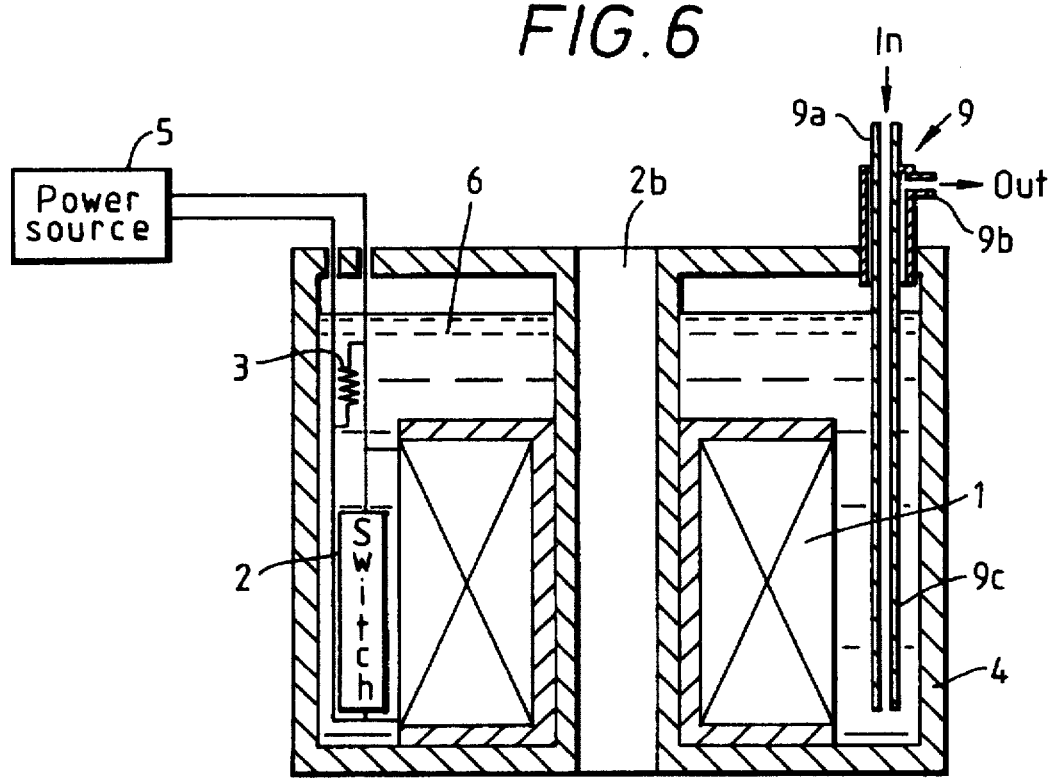
FIG. 6 is a magnetic field generator according to a second embodiment of the present invention.

A second embodiment of the present invention is shown in FIG. 6. The embodiment has many structural similarities to the first embodiment shown in FIG. 1, and corresponding parts are indicated by the same reference numerals. However, in the second embodiment, the superconductive coil 1 is mounted axially around a bore 26 at room temperature.

Embodiment 3

Figure 7:
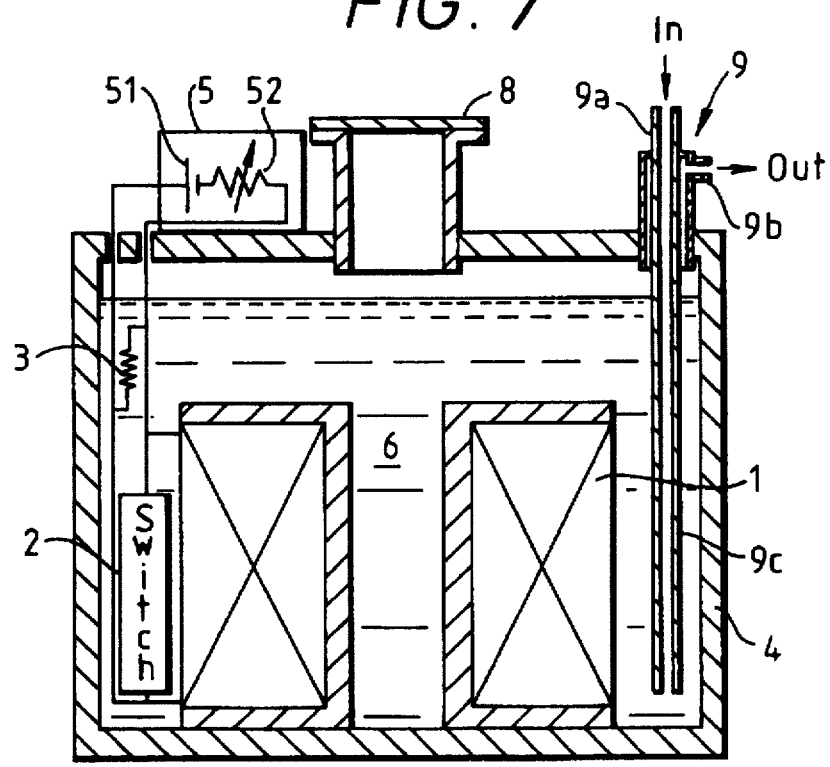
FIG. 7 is a magnetic field generator according to a third embodiment of the present invention.

The third embodiment of the present invention, shown in FIG. 7 is again generally similar to the first embodiment of FIG. 1, and the same reference numerals are used to indicate corresponding parts. In the third embodiment, the power source 5 has a DC power supply 51 with a variable resistor 52 connected in series therewith, to control the current to the superconducting coil. If the magnetic field generated by the superconductive coil 1 reaches a predetermined level, the apparatus may be switched to the persistent current mode, using the persistent current switch 2. If the DC power supply 51 is of dry cells, storage batteries, or other batteries, the magnetic field generator can be made portable.

Embodiment 4

Figure 8:
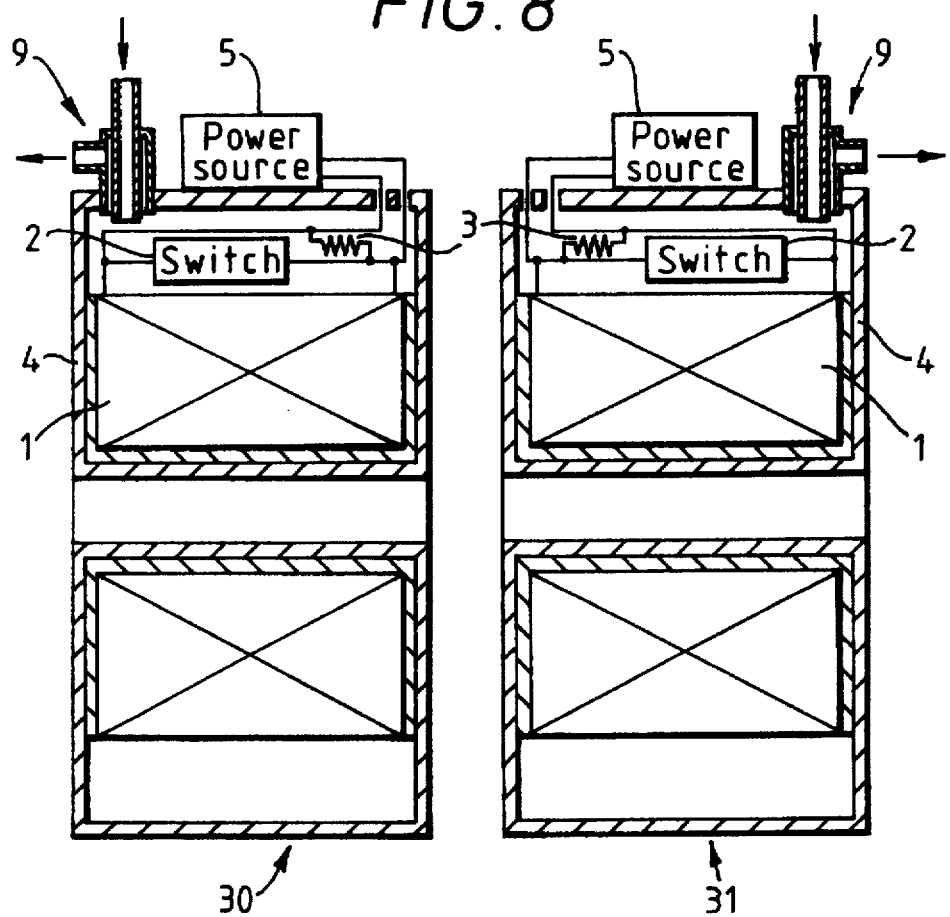
FIG. 8 is a magnetic field generator assembly according to a fourth embodiment of the present invention.

FIG. 8 shows a fourth embodiment of the present invention, in which there are a pair of magnetic field generators 30, 31. Each of those magnetic field generators 30, 31 has a structure similar to that of other embodiments, and corresponding parts are indicated by the same reference numerals. The embodiment of FIG. 8 has the advantage that the space around the centers of the superconductive coils 1 can be made large. It can also be seen that the power source 5 is moved to the radial side of the coils 1, rather than being axial as in the embodiment of FIG. 1.

Embodiment 5

Figure 9:
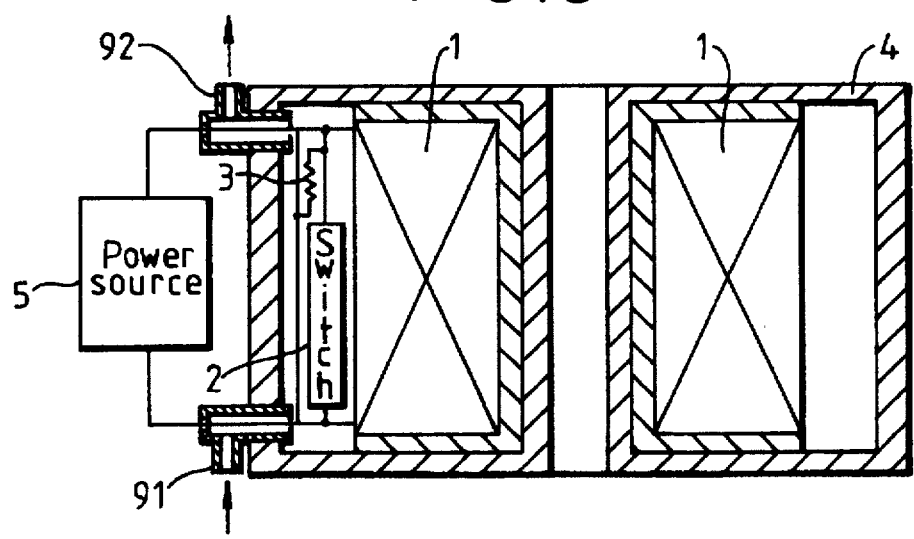
FIG. 9 is a magnetic field generator according to a fifth embodiment of the present invention.

FIG. 9 shows a fifth embodiment of the present invention, which is of the forced-circulation cooling type. Again, corresponding parts are indicated by the same reference numerals.

In this embodiment, there is a coolant inlet 91 at one part of the coolant vessel 4 and a coolant outlet 92 at another part thereof. Coolant is supplied to the inlet 91 and discharged from the outlet 92. The inlet 91 and outlet 92 may also be used for the passage therethrough of leads between the superconductive coil 1 and the power source 5. In such a magnetic field generator, the cooling vessel 4 can be small.

Embodiment 6

Figure 10:
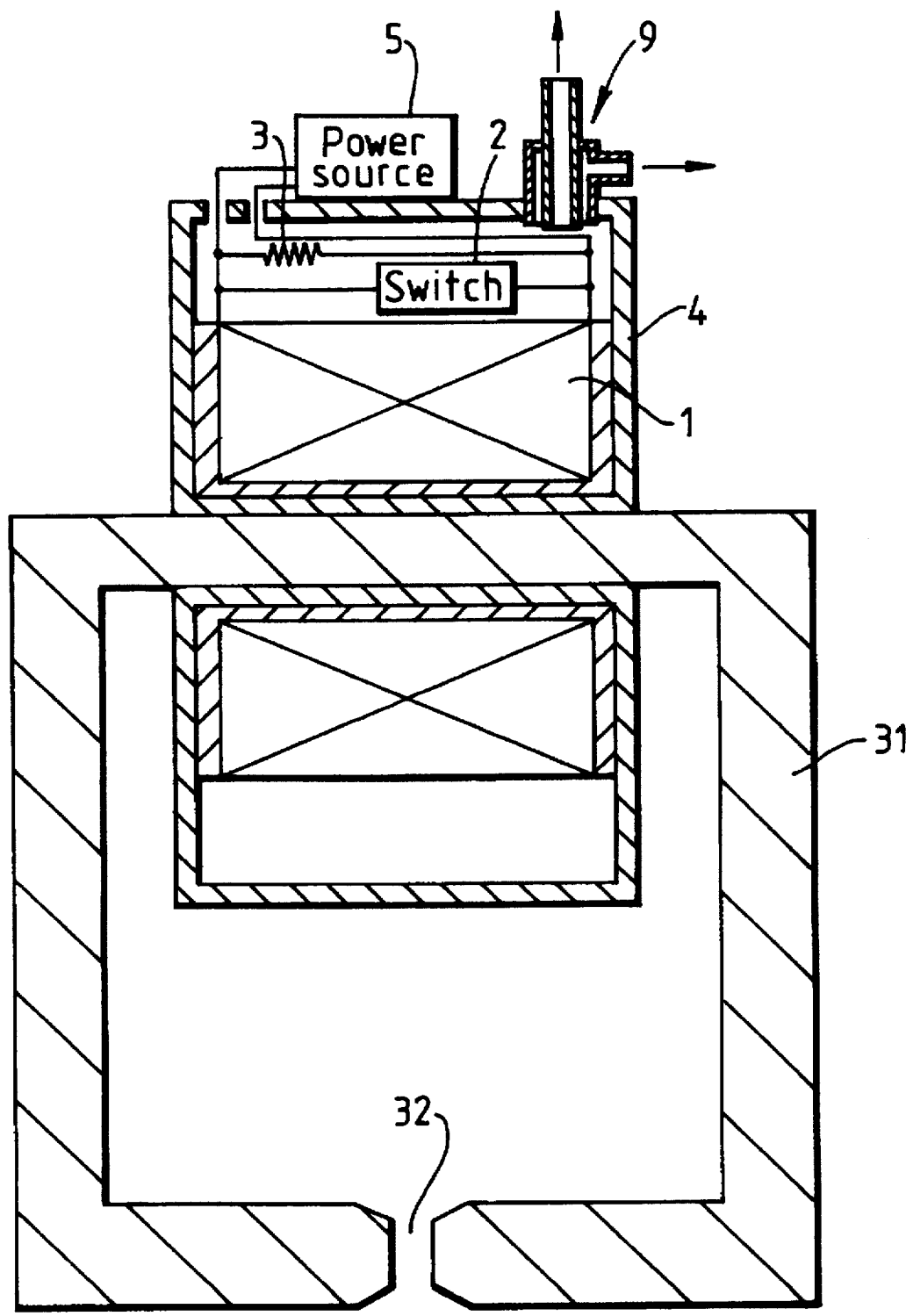
FIG. 10 is a magnetic field generator according to a sixth embodiment of the present invention.

FIG. 10 shows a sixth embodiment of the present invention in which the magnetic field generator has a iron core 31 extending through the superconductive coil 1. Again, corresponding parts are indicated by the same reference numerals.

The iron core 31 forms a magnetic circuit, and has a pole gap 32. Such a magnetic field generator has the advantage that the magnetic field is generated at a region separate from the superconductive coil 1. Of course, the core 31 in this embodiment may be of any magnetic material.

A high magnetic field generator according to the present invention may be used with apparatuses for physics and chemistry, such as a magnetic characteristics measuring apparatus of the vibration sample type for use in measurement of magnetic characteristics of substances, a magnetic field characteristics measuring apparatus having a SQUID therein, and an NMR, an ESR analyzing apparatus, a mass spectrometer, or an electron microscope. It also can be used for Magnetic Resonance Imaging (MRI) in medical diagnosis. It may also be applied to a magnetic separator, a superconducting electromagnetic propelled ship, an inspection apparatus having a SQUID therein for inspection of atomic reactor piping, a single crystal manufacturing apparatus, an MHD generator, a superconducting generator, a nuclear fusion apparatus, or a high energy particle accelerator.

The present invention has the advantage of low operation cost as the permanent current switch can be controlled with little heater power.

What is claimed is:

1. A magnetic field generator, comprising:
a cooling vessel;
coolant material in said cooling vessel;
a superconductive coil in said coolant material for generating a magnetic field;
a power supply connected to said superconductive coil for energizing said superconductive coil;
a persistent current switch unit electrically connected across ends of said superconductive coil, said persistent current switch unit including a superconductive connection, a heater for heating said superconductive connection and a rigid support member having said heater and said superconductive connection supported thereon;
a housing for said persistent current switch unit, said housing including a casing and there being a gap between said casing and said persistent current switch unit, said casing having at least one aperture therein, such that said gap is in communication with an exterior of said casing; and
wherein said heater and said superconductive connection are thermally connected through said solid body member,
whereby a part of said coolant material being in said gap, and said heater contacting said part of said coolant material in said gap; and
wherein a thermal conductivity between an interior of said housing and an exterior of said housing is variable according to a superconductive condition during an off operation of said heater and a non-superconductive condition during an on operation of said heater.

2. A magnetic field generator, comprising:
a cooling vessel;
coolant material in said cooling vessel;
a superconductive coil in said coolant material for generating a magnetic field;
a power supply connected to said superconductive coil for energizing said superconducting coil;
a persistent current switch unit electrically connected across ends of said superconductive coil, said persistent current switch unit including a superconductive connection, a heater for heating said superconductive connection, and a rigid support member having said heater and said superconductive connection supported thereon; and
a housing for said persistent current switch unit;
wherein said heater and said superconductive connection are thermally connected through said solid body member, and
wherein a thermal conductivity between an exterior and interior of said housing and an interior of said housing is variable according to a superconductive condition during an off operation of said heater and a non-superconductive condition during an on operation of said heater.

3. A magnetic field generator according to claim 1, wherein said coolant material is liquid nitrogen.

4. A magnetic field generator according to claim 3, wherein said liquid nitrogen is under a pressure less than atmospheric pressure.

5. A magnetic field generator, comprising:
a cooling vessel;
coolant material in said cooling vessel;
a superconductive coil in said coolant material for generating a magnetic field;
a power supply connected to said superconductive coil for energizing said superconductive coil;
a persistent current switch unit electrically connected across ends of said superconductive coil, said persistent current switch unit including a superconductive connection, a heater for heating said superconductive connection and a solid body member;
a housing for said persistent current switch unit, said housing including a casing and there being a gap between said casing and said persistent current switch unit, said casing having at least one aperture therein, such that said gap is in communication with an exterior of said casing; and
wherein said heater and said superconductive coil are connected through said solid body member,
whereby a part of said coolant material being in said gap, and said heater contacting said part of said coolant material in said gap; and
wherein a thermal conductivity between an interior of said housing and an exterior of said housing is variable according to a superconductive condition during an off operation of said heater and a non-superconductive condition during an on operation of said heater,
wherein said solid body member is an insulating mounting board having first and second opposites surfaces and said superconductive connection and said heater are mounted on said first and second opposite surfaces, respectively.

6. A magnetic field generator according to claim 5, wherein said at least one aperture comprises a plurality of apertures.

7. A magnetic field generator, comprising:
a cooling vessel;
coolant material in said cooling vessel;
a superconductive coil in said coolant material for generating a magnetic field;
a power supply connected to said superconductive coil for energizing said superconductive coil;
a persistent current switch unit electrically connected across ends of said superconductive coil, said persistent current switch unit comprising a superconductive connection, a heater for heating said superconductive connection, and a mounting board;
a housing for said persistent current switch unit, said housing including a casing and there being a gap between said casing and said persistent current switch unit; and
a part of said coolant material being in said gap, and said heater contacting said part of said coolant material in said gap,
wherein said mounting board has first and second opposite surfaces, and said superconductive connection and said heater are mounted on said first and second opposite surfaces of said mounting board, respectively; and
wherein said heater and said superconductive connection are connected through said mounting board; and
wherein a thermal conductivity between an interior of said housing and an exterior of said housing is variable according to a superconductive condition during an off operation of said heater and a non-superconductive condition during an on operation of said heater.

8. A persistent current switch assembly used in a coolant material for a magnetic field generator, comprising:
a persistent current switch unit, said persistent current switch unit including a connection of superconductive material, a heater for heating said connection, and a mounting board, and said superconductive connection and said heater are mounted on said mounting board; and
a housing containing said connection and said heater, said housing including a casing of thermally insulating material and there being a gap between said casing and said persistent current switch unit, and said heater is exposed in said gap; and
a part of said coolant material being in said gap, and said heater contacting said part of said coolant material in said gap;
wherein a thermal conductivity between an interior of said housing and an exterior of said housing is variable according to a superconductive condition during an off operation of said heater and a non-superconductive condition during an on operation of said heater.

9. A persistent current switch assembly used in a coolant material for a magnetic field generator having a superconductive coil, comprising:
a superconductive connection of superconductive material;
a heater for heating said superconductive connection; and
a rigid support member having said heater and said superconductive connection supported thereon, said rigid support member being further for thermally connecting said heater and said superconductive connection;
a housing containing said superconductive connection and said heater;

wherein a thermal conductivity between an interior of said housing and an exterior of said housing is variable according to a superconductive condition during an off operation of said heater and a non-superconductive condition during an on operation of said heater.

10. A persistent current switch assembly used in a coolant material for a magnetic field generator, comprising:
a persistent current switch unit comprising a superconductive connection, a heater for heating said superconductive connection, and a mounting board; and
a housing for said persistent current switch unit, said housing including a casing and there being a gap between said casing and said persistent current switch unit;
wherein said mounting board having first and second opposite surfaces, and said superconductive connection and said heater are mounted on said first and second opposite surfaces, respectively,
wherein the thermal conductivity between an interior of said housing and an exterior of said housing is variable according to a superconductive condition during an on-operation of said heater and a non-superconductive condition during an off-operation of said heater.

11. A method of controlling a magnetic field generator, comprising:
generating a magnetic field using a superconductive coil in a coolant material;
shorting ends of said superconductive coil through a persistent current switch unit having a superconductive connection in a superconducting state; and
providing a rigid support member having a heater and said superconductive connection supported therein;
heating said heater and allowing heat to thermally conduct through said rigid support member to said superconductive connection to cause said superconductive connection to change from said superconducting state to a non-superconducting state;
wherein said superconductive connection is in a housing with a gap between a casing of said housing and said superconductive connection, a part of said coolant material is in said gap, and said heating of said superconductive connection is such as to cause said part of said coolant material to change from a liquid state to a gaseous state;
wherein said method includes the step of connecting said superconductive connection and said superconductive coil;
wherein said method further includes the step of varying a thermal conductivity provided between an interior of said housing and an exterior of said housing according to a superconductive condition during an off-operation of said heater and a non-superconductive condition during an on-operation of said heater.

12. A method of controlling a magnetic field generator, comprising:
generating a magnetic field using a superconductive coil in a coolant material;
shorting ends of said superconductive coil through a persistent current switch having a superconductive connection in a superconducting state;
providing a rigid support member having a heater and said superconductive connection supported therein; and
heating said heater and allowing heat to thermally conduct through said rigid support member to said superconductive connection to cause said superconductive connection to change from said superconducting state to a non-superconducting state;

wherein said superconductive connection is in a housing with a gap between a casing of said housing and said superconductive connection, and a part of said coolant material is in said gap; and wherein said method includes the step of connecting said superconductive connection and said superconductive coil;

wherein said method further includes the step of stopping said heating of said superconductive connection, said stopping of said heating causing said superconductive connection to change from said non-superconducting state to said superconducting state;

wherein said method further includes the step of varying a thermal conductivity between an interior of said housing and an exterior of said housing according to a superconductive condition during an off-operation of said heater and a non-superconductive condition during an on-operation of said heater.

13. A magnetic field generator, comprising:

a cooling vessel:

coolant material in said cooling vessel;

a superconductive coil in said coolant material for generating a magnetic field;

a power supply connected to said superconductive coil for energizing said superconductive coil;

a persistent current switch unit electrically connected across ends of said superconductive coil, said persistent current switch unit comprising a superconductive connection in a convoluted layout arrangement, a heater for heating said superconductive connection, and a mounting board having said superconductive connection mounted on a first surface and having said heater mounted on a second surface opposite to said first surface, said mounting board providing a thermal conductivity path between said superconductive connection and said heater; and wherein said heater and said superconductive correction are connected through said mounting board;

a housing for said persistent current switch unit, said housing including a casing having at least one aperture and there being a gap between said casing and said persistent current switch unit, said at least one aperture and said gap allowing flow of said coolant material between an interior of said housing and an exterior of said housing and over said persistent current switch unit during a superconducting operation of said persistent current switch unit, said gap being of a minimized size so as to minimize a volume of said coolant material within said housing for vaporization by said heater during a non-superconductivity operation without inhibiting said flow, and a pressure of a vaporized said coolant material within said gap during a non-superconducting operation of said persistent current switch unit cooperates with an arrangement of said at least one aperture to prevent flow of said coolant material from an exterior of said housing to said heater, whereby during a non-superconductive operation of said persistent current switch unit, a thermal conductivity between an interior and an exterior of said housing is minimized while said thermal conductive path is provided between said superconductive connection and said heater.

14. A magnetic field generator as claimed in claim 13, wherein a spacing of said gap is within a range of 0.1 mm to 10 mm.

15. A magnetic field generator comprising:

a cooling vessel:

coolant material in said cooling vessel;

a superconductive coil in said coolant material for generating a magnetic field;

a power supply connected to said superconductive coil for energizing said superconductive coil;

a persistent current switch unit electrically connected across ends of said superconductive coil, said persistent current switch unit comprising a superconductive connection in a convoluted layout arrangement, a heater for heating said superconductive connection, and a mounting board having said superconductive connection mounted on a first surface and having said heater mounted on a second surface opposite to said first surface, said mounting board providing a thermal conductivity path between said superconductive connection and said heater; and a housing for said persistent current switch unit, said housing including a casing having at least one aperture and there being a gap between said casing and said persistent current switch unit, said at least one aperture and said gap allowing flow of said coolant material between an interior of said housing and an exterior of said housing and over said persistent current switch unit during a superconducting operation of said persistent current switch unit, said gap being of a minimized size so as to minimize a volume of said coolant material within said housing for vaporization by said heater during a non-superconductivity operation without inhibiting said flow, and a pressure of a vaporized said coolant material within said gap during a non-superconducting operation of said persistent current switch unit cooperates with an arrangement of said at least one aperture to prevent flow of said coolant material from an exterior of said housing to said heater, whereby during a non-superconductive operation of said persistent current switch unit, a thermal conductivity between said interior of said housing and said exterior of said housing is minimized while said thermal conductive path is provided between said superconductive connection and said heater, wherein a thickness of said casing, a spacing of said gap and a width of said at least one aperture are all substantially 1 mm.

16. A superconducting circuit arrangement, comprising:

a cooling vessel;

coolant material in said cooling vessel;

a superconductive circuit in said coolant material for flowing a superconductive current;

a power supply connected to said superconductive circuit for energizing said superconductive circuit;

a persistent current switch unit electrically connected across ends of said superconductive circuit, said persistent current switch unit including a superconductive connection, a heater for heating said superconductive connection and a rigid support member having said heater and said superconductive connection supported thereon and providing a thermal conduction path between said heater and said superconductive connection;

a housing for said persistent current switch unit, said housing including a casing and there being a gap between said casing and said persistent current switch unit, said casing having at least one aperture therein, such that said gap is in communication with an exterior of said casing; and whereby a part of said coolant material being in said gap, and said heater contacting said part of said coolant material in said gap; and wherein a thermal conductivity between an interior of said housing and an exterior of said housing is variable according to a superconductive condition during an off operation of said heater and a non-superconductive condition during an on operation of said heater.

* * * * *